(12) United States Patent
Jang et al.

(10) Patent No.: US 11,994,704 B2
(45) Date of Patent: *May 28, 2024

(54) HOLOGRAM MEDIUM

(71) Applicant: LG CHEM, LTD., Seoul (KR)

(72) Inventors: Seokhoon Jang, Daejeon (KR);
Jinseok Byun, Daejeon (KR); Heon Kim, Daejeon (KR); Se Hyun Kwon, Daejeon (KR); Yeongrae Chang, Daejeon (KR)

(73) Assignee: LG CHEM, LTD., Seoul (KR)

( * ) Notice: Subject to any disclaimer, the term of this patent is extended or adjusted under 35 U.S.C. 154(b) by 771 days.

This patent is subject to a terminal disclaimer.

(21) Appl. No.: 16/972,547

(22) PCT Filed: Sep. 11, 2019

(86) PCT No.: PCT/KR2019/011874
§ 371 (c)(1),
(2) Date: Dec. 4, 2020

(87) PCT Pub. No.: WO2020/067668
PCT Pub. Date: Apr. 2, 2020

(65) Prior Publication Data
US 2021/0239894 A1 Aug. 5, 2021

(30) Foreign Application Priority Data
Sep. 27, 2018 (KR) .................. 10-2018-0115322

(51) Int. Cl.
*G02B 5/32* (2006.01)
*C08L 33/10* (2006.01)
*G03F 7/075* (2006.01)
*G03H 1/02* (2006.01)

(52) U.S. Cl.
CPC ............... *G02B 5/32* (2013.01); *C08L 33/10* (2013.01); *G03F 7/075* (2013.01); *G03H 2001/0264* (2013.01); *G03H 2260/12* (2013.01)

(58) Field of Classification Search
None
See application file for complete search history.

(56) References Cited

U.S. PATENT DOCUMENTS

| 4,842,968 | A | * | 6/1989 | Kojima | G03F 7/001 |
|---|---|---|---|---|---|
| | | | | | 430/1 |
| 7,364,340 | B2 | | 4/2008 | Choi et al. | |
| 7,751,104 | B2 | | 7/2010 | Hayashibe et al. | |
| 9,114,601 | B2 | | 8/2015 | Baldwin et al. | |
| 11,079,678 | B2 | * | 8/2021 | Jang | C08L 33/06 |
| 11,084,933 | B2 | * | 8/2021 | Kim | G03F 7/028 |
| 11,126,082 | B2 | * | 9/2021 | Jang | G11B 7/245 |
| 11,226,557 | B2 | * | 1/2022 | Jang | C08L 51/08 |
| 11,307,494 | B2 | * | 4/2022 | Kim | C09D 4/06 |
| 11,435,664 | B2 | * | 9/2022 | Kim | G03F 7/001 |
| 2002/0110740 | A1 | * | 8/2002 | Otaki | G03F 7/027 |
| | | | | | 430/1 |
| 2003/0148192 | A1 | * | 8/2003 | Ashizaki | G03H 1/04 |
| | | | | | 430/1 |
| 2005/0277747 | A1 | | 12/2005 | McLaughlin et al. | |
| 2007/0206251 | A1 | | 9/2007 | Hayashibe et al. | |
| 2009/0231648 | A1 | | 9/2009 | Imanishi et al. | |
| 2009/0311441 | A1 | | 12/2009 | Bae et al. | |
| 2011/0207029 | A1 | | 8/2011 | Hagen et al. | |
| 2017/0362165 | A1 | * | 12/2017 | Fäcke | G03H 1/0248 |
| 2018/0217312 | A1 | | 8/2018 | Hiraoka et al. | |
| 2019/0041745 | A1 | | 2/2019 | Ibe et al. | |
| 2021/0003919 | A1 | * | 1/2021 | Kim | G03F 7/105 |
| 2023/0142827 | A1 | * | 5/2023 | Lee | C09D 183/10 |
| | | | | | 430/1 |

FOREIGN PATENT DOCUMENTS

| EP | 3514627 A1 | 7/2019 | |
|---|---|---|---|
| EP | 3588499 A1 | 1/2020 | |
| JP | H08-101499 A | 4/1996 | |
| JP | H09-212069 A | 8/1997 | |
| JP | 2002236439 A * | 8/2002 | ............ G03F 7/001 |
| JP | 2005-115264 A | 4/2005 | |
| JP | 2006-350343 A | 12/2006 | |
| JP | 2007-233143 A | 9/2007 | |
| JP | 2009-217061 A | 9/2009 | |
| JP | 2012-504777 A | 2/2012 | |
| JP | 2014-026116 A | 2/2014 | |
| JP | 2015-513700 A | 5/2015 | |
| JP | 2015-123646 A | 7/2015 | |
| KR | 2005027567 A * | 3/2005 | |
| KR | 10-2007-0022321 A | 2/2007 | |
| KR | 10-0786800 B1 | 12/2007 | |
| KR | 2008080862 A * | 9/2008 | |
| KR | 10-2011-0066926 A | 6/2011 | |
| WO | 2017-195586 A1 | 11/2017 | |
| WO | WO-2019066313 A1 * | 4/2019 | ................ C08F 2/50 |
| WO | 2019-112358 A1 | 6/2019 | |
| WO | WO-2019112358 A1 * | 6/2019 | ............. C08L 51/08 |
| WO | WO-2019117540 A1 * | 6/2019 | ............ C08F 265/06 |
| WO | WO-2019231117 A1 * | 12/2019 | ............. C07F 7/081 |

OTHER PUBLICATIONS

Extended European Search Report dated Sep. 10, 2021, of the corresponding European Patent Application No. 19866649.7, 9 pages.

(Continued)

Primary Examiner — Martin J Angebranndt
(74) Attorney, Agent, or Firm — ROTHWELL, FIGG, ERNST & MANBECK, P.C.

(57) ABSTRACT

The present disclosure relates to a hologram recording medium having one surface with a higher surface energy than a polymer resin layer containing at least one polymer selected from the group consisting of triacetyl cellulose, alicyclic olefin polymer and polyethylene terephthalate, a hologram recording medium wherein the surface energy of any one surface is 50 mN/m or more, and an optical element comprising the hologram medium.

11 Claims, 3 Drawing Sheets

(56) References Cited

OTHER PUBLICATIONS

International Search Report dated Jan. 7, 2020, issued in International Application No. PCT/KR2019/011874, 4 pages.

* cited by examiner

【FIG. 1】
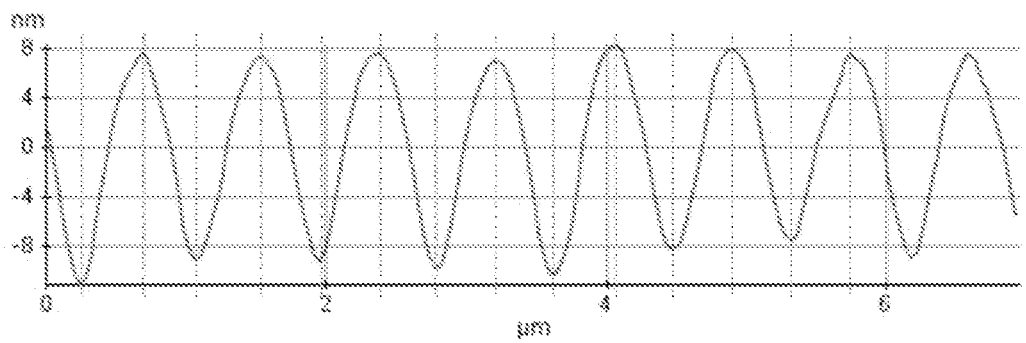
【FIG. 2】
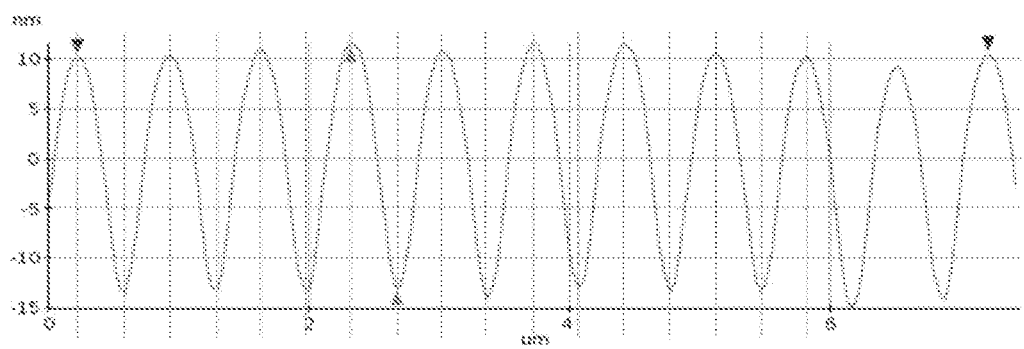
【FIG. 3】
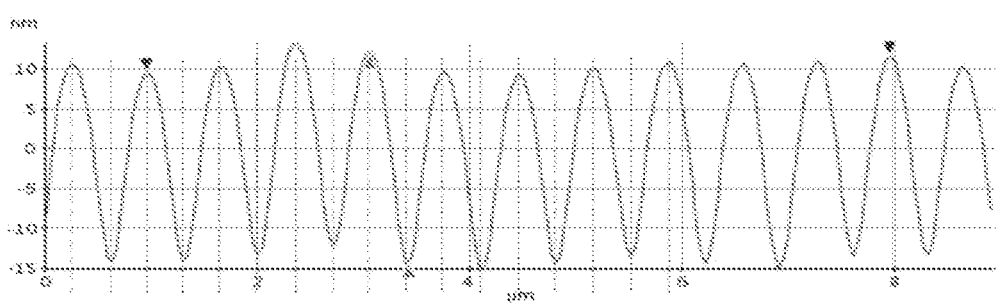

[FIG. 4]
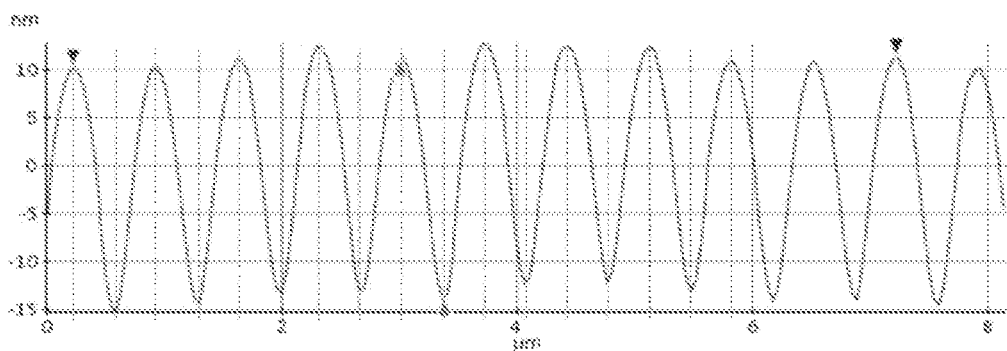
[FIG. 5]
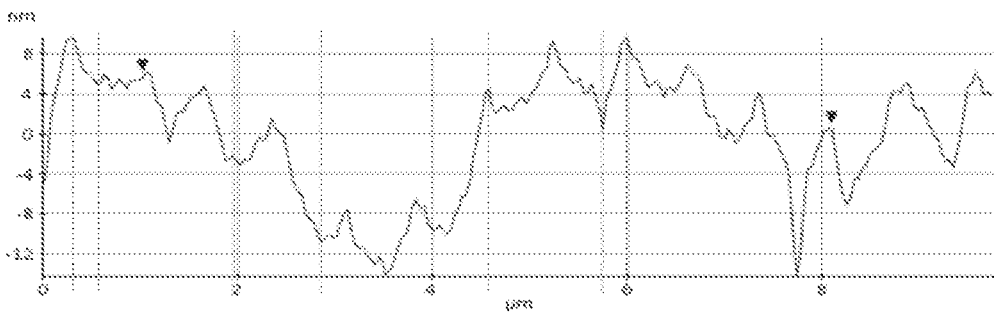
[FIG. 6]
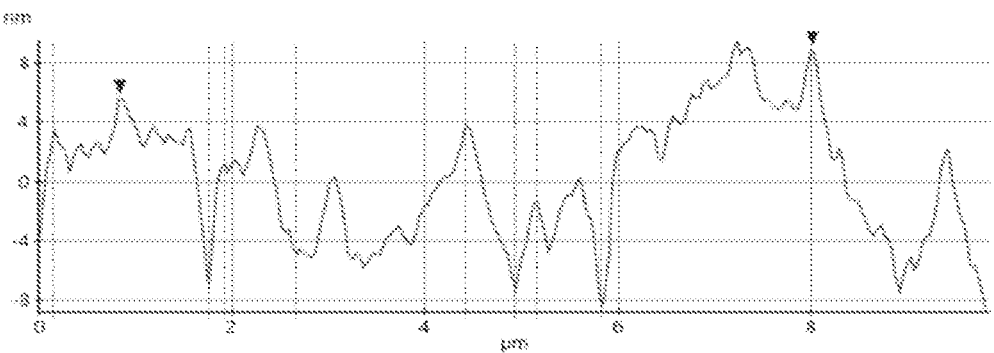

[FIG. 7]
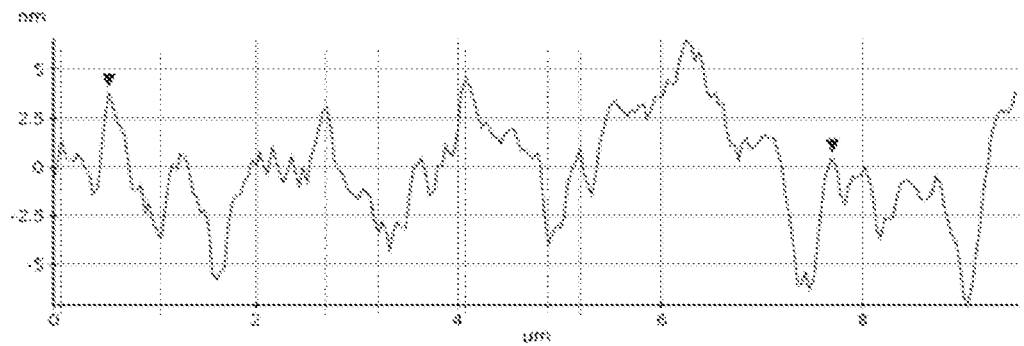

HOLOGRAM MEDIUM

CROSS-REFERENCE TO RELATED APPLICATION(S)

This application is a 35 U.S.C. 371 National Phase Entry Application from PCT/KR2019/011874, filed on Sep. 11, 2019, designating the United States, which claims the benefit of Korean Patent Application No. 10-2018-0115322 filed on Sep. 27, 2018 with the Korean Intellectual Property Office, the disclosures of which are herein incorporated by reference in their entirety.

TECHNICAL FIELD

The present disclosure relates to a hologram medium and an optical element.

BACKGROUND OF THE INVENTION

Hologram recording medium records information by changing a refractive index in the holographic recording layer in the medium through an exposure process, reads the variation of refractive index in the medium thus recorded, and reproduces the information.

When a photopolymer (photosensitive resin) is used, the light interference pattern can be easily stored as a hologram by photopolymerization of the low molecular weight monomer. Therefore, the photopolymer can be used in various fields such as optical lenses, mirrors, deflecting mirrors, filters, diffusing screens, diffraction elements, light guides, waveguides, holographic optical elements having projection screen and/or mask functions, medium of optical memory system and light diffusion plate, optical wavelength multiplexers, reflection type, transmission type color filters, and the like.

Typically, a photopolymer composition for hologram production comprises a polymer binder, a monomer, and a photoinitiator, and the photosensitive film produced from such a composition is irradiated with laser interference light to induce photopolymerization of local monomers.

In a portion where a relatively large number of monomers are present in such photopolymerization process, the refractive index becomes high. And in a portion where a relatively large number of polymer binders are present, the refractive index is relatively lowered and thus the refractive index modulation occurs, and a diffraction grating is generated by such refractive index modulation. The value n of refractive index modulation is influenced by the thickness and the diffraction efficiency (DE) of the photopolymer layer, and the angular selectivity increases as the thickness decreases.

Recently, development of materials capable of maintaining a stable hologram with a high diffraction efficiency has been demanded, and also various attempts have been made to manufacture a photopolymer layer having a large value of refractive index modulation even while having a thin thickness.

BRIEF SUMMARY OF THE INVENTION

The present disclosure provides a hologram medium which can prevent light loss due to reflection, scattering, and absorption caused by the influence of a light-transmissive substrate, can realize a higher refractive index modulation value and diffraction efficiency even in the range of a thin thickness, and can provide lighter and smaller-sized products by removing the substrate when applied to VR (Virtual Reality) devices or AR (Augmented Reality) devices.

The present disclosure also provides an optical element comprising the above-mentioned hologram medium.

Provided herein is a hologram recording medium having one surface with a higher surface energy than a polymer resin layer containing at least one polymer selected from the group consisting of triacetyl cellulose, alicyclic olefin polymer and polyethylene terephthalate.

Also provided herein is a hologram recording medium in which the surface energy of any one surface is 50 mN/m or more.

Further provided herein is an optical element including the above-mentioned hologram medium.

DETAILED DESCRIPTION OF THE INVENTION

Hereinafter, a hologram medium and an optical element according to specific embodiments of the present disclosure will be described in more detail.

As used herein, the term "(meth)acrylate" refers to either methacrylate or acrylate.

As used herein, the term "(co)polymer" refers to either a homopolymer or a copolymer (including a random copolymer, a block copolymer, and a graft copolymer).

As used herein, the term "hologram" refers to a recording medium in which optical information is recorded in an entire visible range and a near ultraviolet range (300 to 800 nm) through an exposure process, and examples thereof include all of visual holograms such as in-line (Gabor) holograms, off-axis holograms, full-aperture transfer holograms, white light transmission holograms ("rainbow holograms"). Denisyuk holograms, off-axis reflection holograms, edge-lit holograms or holographic stereograms.

In the present specification, the alkyl group may be a straight chain or a branched chain, and the number of carbon atoms thereof is not particularly limited, but is preferably 1 to 40. According to one embodiment, the alkyl group has 1 to 20 carbon atoms. According to another embodiment, the alkyl group has 1 to 10 carbon atoms. According to still another embodiment, the alkyl group has 1 to 6 carbon atoms. Specific examples of the alkyl group include methyl, ethyl, propyl, n-propyl, isopropyl, butyl, n-butyl, isobutyl, tert-butyl, sec-butyl, 1-methyl-butyl, 1-ethyl-butyl, pentyl, n-pentyl, isopentyl, neopentyl, tert-pentyl, hexyl, n-hexyl, 1-methylpentyl, 2-methylpentyl, 4-methyl-2-pentyl, 3,3-dimethylbutyl, 2-ethylbutyl, heptyl, n-heptyl, 1-methylhexyl, cyclopentylmethyl, cyclohexylmethyl, octyl, n-octyl, tert-octyl, 1-methylheptyl, 2-ethylhexyl, 2-propylpentyl, n-nonyl, 2,2-dimethylheptyl, 1-ethyl-propyl, 1,1-dimethylpropyl, isohexyl, 2-methylpentyl, 4-methylhexyl, 5-methylhexyl, and the like, but are not limited thereto.

In the present specification, the alkylene group is a bivalent functional group derived from alkane, and may be, for example, linear, branched or cyclic methylene group, ethylene group, propylene group, isobutylene group, sec-butylene group, tert-butylene group, pentylene group, hexylene group, and the like.

According to one embodiment of the present disclosure, there may be provided a hologram recording medium having one surface with a higher surface energy than a polymer resin layer containing at least one polymer selected from the group consisting of triacetyl cellulose, alicyclic olefin polymer and polyethylene terephthalate.

According to another embodiment of the present disclosure, there may be provided a hologram recording medium in which a surface energy of any one surface is 50 mN/m or more.

The present inventors have prepared a hologram recording medium having a higher surface energy than a polymer resin layer containing at least one polymer selected from the group consisting of triacetyl cellulose, alicyclic olefin polymer and polyethylene terephthalate, or having a surface energy of any one surface of 50 mN/m or more, and have found through experiments that such a hologram recording medium can be easily peeled off from a polymer resin layer or other substrate containing at least one polymer selected from the group consisting of triacetyl cellulose, alicyclic olefin polymer and polyethylene terephthalate without separate surface damage or deterioration of physical properties.

Usually, the hologram recording medium is used in the form of being coated on an optical substrate such as triacetyl cellulose, alicyclic olefin polymer and polyethylene terephthalate, but light loss due to reflection, scattering, and absorption occurs due to the optical substrate. In addition, previously known hologram recording media or photopolymers for producing the same have not been easily peeled off after coating on the above-mentioned optical substrate, and there was a limit that surface properties or physical properties at the time of peeling are deteriorated.

On the contrary, as the hologram recording medium of one embodiment has higher surface energy than the polymer resin layer containing at least one polymer selected from the group consisting of triacetyl cellulose, alicyclic olefin polymer and polyethylene terephthalate, it can be easily peeled off from a commonly used optical substrate or the like, without deteriorating surface properties or physical properties, and thus, it can be applied to various fields while having more improved optical properties.

Further, the hologram recording medium of the other embodiment has a surface energy of any one surface of 50 mN/m or more, so that it can be easily peeled off from a commonly used optical substrate without deterioration of surface properties or physical properties, and thus can be applied to various fields while having more improved optical properties.

The hologram recording medium of the one embodiment may have one surface with a higher surface energy than a polymer resin layer containing at least one polymer selected from the group consisting of triacetyl cellulose, alicyclic olefin polymer and polyethylene terephthalate, and the specific surface energy of this one surface may be 50 mN/m or more, or 50 mN/m to 60 mN/m.

In addition, the hologram recording medium according to another embodiment may have a surface energy of any one surface of 50 mN/mm or more, or 50 mN/m to 60 mN/m.

The surface characteristics possessed by the hologram recording medium of the above-described embodiments are considered to result from the characteristics of the polymer substrate contained therein.

More specifically, the hologram recording medium may include a polymer substrate including a polymer resin in which is silane-based functional group is located in a main chain or a branched chain.

Since the polymer resin in which the silane-based functional group is located in the main chain or branched chain has a high equivalent weight of silane as the main functional group and has a very low sol-gel crosslinking degree, it appears that the surface energy is relatively high. Further, alkyl chains in the form of acrylate and polyethylene oxide with relatively high surface tension occupy most of the coating layer, and the silicone component or fluorine compound of the matrix can improve the release property of the coating layer.

One surface of the polymer substrate may have a higher surface energy than a polymer resin layer containing at least one polymer selected from the group consisting of triacetyl cellulose, alicyclic olefin polymer and polyethylene terephthalate, and one surface of the polymer substrate may have a surface energy of 50 mN/m more, or 50 mN/m to 60 mN/m.

Meanwhile, a fine pattern may be formed on the other one surface of the hologram recording media of the above-described embodiments, that is, on a surface opposite to the one surface having the above-mentioned surface energy characteristics.

In the polymer substrate wherein the silane-based functional group is formed from a photopolymer composition containing a polymer resin located in a main chain or a branched chain, in the hologram recording process using light such as a coherent laser or electromagnet/radiation, diffusion of photoreactive monomers is uniformly generated and thus, curing shrinkage of the polymer substrate is also uniformly generated.

Thereby, according to the curing shrinkage of the polymer substrate that is uniformly generated, a fine pattern may be uniformly and regularly formed on at least one surface of the polymer substrate (on a surface opposite to one surface having the above-mentioned surface energy), and such hologram media can achieve high diffraction efficiency.

In addition, the hologram medium of the embodiments comprises a polymer substrate including a polymer resin in which the silane-based functional group is located in a main chain or a branched chain, thereby realizing significantly improved refractive index modulation value and excellent resistance to temperature and humidity compared to previously known holograms.

The fine pattern may have a shape including two or more fine protrusions in which a maximum value of the height and a minimum value of the height are alternately repeated based on the cross section of the polymer substrate.

The standard error of the distance in the cross-sectional direction of the polymer substrate between the maximum value of the height of the one fine protrusion and the minimum value of the height of the adjacent fine protrusion may be 20 nm or less, or 1 to 20 nm.

As the standard error of the distance in the cross-sectional direction of the polymer substrate between the maximum value of the height of the one fine protrusion and the minimum value of the height of the adjacent fine protrusion is 20 nm or less, the hologram medium can have more image sharpness or higher diffraction efficiency.

On the contrary, when the standard error of the distance in the cross-sectional direction of the polymer substrate between the maximum value of the height of the one fine protrusion and the minimum value of the height of the adjacent fine protrusion is higher than the above range, image distortion phenomenon may occur from the hologram medium, additional scattering or interference of diffracted light may occur, and the diffraction efficiency may also be reduced.

The standard error of the distance in the cross-sectional direction of the polymer substrate between the maximum value of the height of the one fine protrusion and the minimum value of the height of the adjacent fine protrusion may be defined by the following general formula 1.

$$SE = \sigma/\sqrt{n} \qquad \text{[General Formula 1]}$$

in the general formula 1, SE is a standard error, σ is a standard deviation, and n is a number.

Further, the standard error of the distance in the cross-sectional direction of the polymer substrate between the maximum value of the height of the one fine projection and the minimum value of the adjacent fine projection can be determined as a standard deviation of the sample mean distribution between adjacent minimum and maximum values in the line profile of the surface shape of the hologram medium measured by an atomic force microscope.

Meanwhile, the distance in the cross-sectional direction of the polymer substrate between the maximum value of the height of the one fine projection and the minimum value of the adjacent fine projection may be 0.2 μm to 2 μm, or 0.3 μm to 1 μm.

Further, the amplitude which is the difference between the maximum value of the height of the one fine projection and the minimum value of the height of the adjacent fine projection may be 5 to 50 nm.

As described above, the polymer substrate may include a polymer resin in which silane-based functional group is located in a main chain or a branched chain. Examples of the polymer resin are not particularly limited, and specific examples thereof include (meth)acrylate-based (co)polymers in which a silane-based functional group is located in a main chain or a branched chain.

More specifically, the polymer substrate may include a cross-linked product between a polymer matrix including a (meth)acrylate-based (co)polymer in which a silane-based functional group is located in a branched chain and a silane crosslinking agent; and a photoreactive monomer.

A crosslinked structure mediating a siloxane bond can be easily introduced through a sol-gel reaction between a modified (meth)acrylate-based (co)polymer containing a silane-based functional group and a silane crosslinking agent containing a terminal silane-based functional group, and excellent durability against temperature and humidity can be ensured through such siloxane bond. Further, as described above, in the hologram recording process, diffusion of photoreactive monomers and curing shrinkage of the polymer substrate can be uniformly generated, and thereby, the curing shrinkage of the polymer substrate is also uniformly generated. Due to the curing shrinkage of the polymer substrate that is uniformly generated, a fine pattern may be uniformly and regularly formed on at least one surface of the polymer substrate. Thus, the hologram media of the embodiment can achieve high diffraction efficiency.

In the polymer matrix, the (meth)acrylate-based (co)polymer in which the silane-based functional group is located in the branched chain and the silane crosslinking agent can be present as separate components, respectively, and they may also exist in the form of a complex formed by reacting with each other.

In the (meth)acrylate-based (co)polymer, the silane-based functional group may be located in a branched chain. The silane-based functional group may include a silane functional group or an alkoxysilane functional group. Preferably, a trimethoxysilane group can be used as the alkoxysilane functional group.

The silane-based functional group may form siloxane bonds through a sol-gel reaction with the silane-based functional group contained in the silane crosslinking agent to crosslink the (meth)acrylate-based (co)polymer and the silane crosslinking agent.

Meanwhile, the (meth)acrylate-based (co)polymer in which the silane-based functional group is located in the branched chain may include a (meth)acrylate repeating unit in which the silane-based functional group is located in a branched chain, and a (meth)acrylate repeating unit.

An example of the (meth)acrylate repeating unit in which the silane-based functional group is located in a branched chain may include a repeating unit represented by the following Chemical Formula 1.

[Chemical Formula 1]

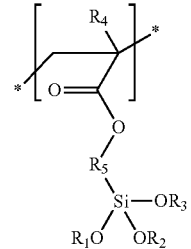

in the Chemical Formula 1, $R_1$ to $R_3$ are each independently alkyl group having 1 to 10 carbon atoms, $R_4$ is hydrogen or an alkyl group having 1 to 10 carbon atoms, and $R_5$ is an alkylene group having 1 to 10 carbon atoms.

Preferably, in Chemical Formula 1, $R_1$ to $R_3$ are each independently a methyl group having one carbon atom, $R_4$ is a methyl group having one carbon atom and $R_5$ is a propylene group having 3 carbon atoms, which may be a repeating unit derived from methacryloxypropyltrimethoxysilane (KBM-503), or $R_1$ to $R_3$ are each independently a methyl group having one carbon atom, $R_4$ is hydrogen and $R_5$ is a propylene group having 3 carbon atoms, which may be a repeating unit derived from 3-acryloxypropyltrimethoxysilane (KBM-5103).

Further, an example of the (meth acrylate repeating unit may include a repeating unit represented by the following Chemical Formula 2.

[Chemical Formula 2]

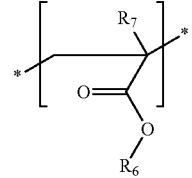

in the Chemical Formula 2, $R_6$ is an alkyl group having 1 to 20 carbon atoms, $R_7$ is hydrogen or an alkyl group having 1 to 10 carbon atoms. Preferably, in the Chemical Formula 2, $R_6$ is a butyl group having 4 carbon atoms and $R_7$ is hydrogen, which may be a repeating unit derived from butyl acrylate.

The molar ratio between the repeating unit of Chemical Formula 2 and the repeating unit of Chemical Formula 1 may be 0.5:1 to 14:1. When the molar ratio of the repeating unit of Chemical Formula 1 is excessively reduced, the crosslinking density of the matrix becomes too low to serve as a support, resulting in a decrease in recording characteristics after recording. When the molar ratio of the repeating unit of Chemical Formula 1 is excessively increased, the crosslinking density of the matrix becomes too high and the mobility of the respective components decreases, resulting in a decrease in the refractive index modulation value.

The weight average molecular weight (measured by GPC) of the (meth)acrylate-based (co)polymer may be 100,000 to 5,000,000, or 300,000 to 900,000. The weight average molecular weight means a weight average molecular weight (unit: g/mol) converted in terms of polystyrene measured by GPC method. In the process of determining the weight average molecular weight converted in terms of polystyrene measured by the GPC method, a commonly known analyzing device, a detector such as a refractive index detector, and an analytical column can be used. Commonly applied conditions for temperature, solvent, and flow rate can be used. Specific examples of the measurement conditions man include a temperature of 30° C., chloroform solvent and a flow rate of 1 mL/min.

Meanwhile, in the (meth)acrylate-based (co)polymer in which the silane-based functional group is located in a branched chain, the equivalent weight of the silane-based functional group may be 300 g/eq. to 2000 g/eq., or 500 g/eq. to 2000 g/eq., or 550 g/eq. to 1800 g/eq., or 580 g/eq. to 1600 g/eq., or 586 g/eq. to 1562 g/eq. The silane-based functional group equivalent weight is an equivalent weight (g/eq.) of one silane-based functional group, and is a value obtained by dividing the weight average molecular weight of the (meth)acrylate-based (co)polymer by the number of silane-based functional groups per molecule. The smaller the equivalent value, the higher the density of the functional group, and the larger the equivalent value, the smaller the density of the functional group.

Consequently, the crosslinking density between the (meth)acrylate-based (co)polymer and the silane crosslinking agent can be optimized, thereby ensuring superior durability against temperature and humidity as compared with conventional matrixes. In addition, through the optimization of the crosslinking density as described above, the mobility between the photoreactive monomer having a high refractive index and a component having a low refractive index is increased, thereby maximizing the modulation of the refractive index and improving recording characteristics.

When the equivalent weight of the silane-based functional group contained in the (meth)acrylate-based (co)polymer in which the silane-based functional group is located in a branched chain is excessively reduced to less than 300 g/eq., the crosslinking density of the matrix becomes too high and the mobility of components is inhibited, thereby causing a decrease in the recording characteristics.

Further, when the equivalent weight of the silane-based functional group contained in the (meth)acrylate-based (co) polymer in which the silane-based functional group is located in a branched chain is excessively increased to more than 2000 g/eq., the crosslinking density is too low to serve as a support, so that the boundary surface between the diffraction gratings generated after recording collapses, and the value of the refractive index modulation may decrease over time.

Meanwhile, the silane crosslinking agent may be a compound having an average of at least one silane-based functional group per molecule or a mixture thereof, and it may be a compound containing at least one silane-based functional group. The silane-based functional group may include a silane functional group or an alkoxysilane, functional group. Preferably, a triethoxysilane group can be used as the alkoxysilane functional group. The silane-based functional group can form siloxane bonds through a sol-gel reaction with the silane-based functional group contained in the (meth)acrylate-based (co)polymer, thereby crosslinking the (meth)acrylate-based (co)polymer and the silane crosslinking agent.

In this case, the silane crosslinking agent may have a silane-based functional group equivalent weight of 200 g/eq. to 1000 g/eq. Thus, the crosslinking density between the (meth)acrylate-based (co)polymer and the silane crosslinking agent can be optimized, thereby ensuring superior durability against temperature and humidity as compared with conventional matrixes. In addition, through the optimization of the crosslinking density as described above, the mobility between a photoreactive monomer having a high refractive index and a component having a low refractive index can be increased, thereby maximizing the refractive index modulation and improving the recording characteristics.

When the equivalent weight of the silane-based functional group contained in the silane crosslinking agent is excessively increased to more than 1000 e/eq., the diffraction grating interface after recording may be collapsed due to the decrease of the crosslinking density of the matrix. In addition, due to the loose crosslinking density and the low glass transition temperature, the monomer and plasticizer components can be eluted on the surface to cause haze. When the equivalent weight of the silane-based functional group contained in the silane crosslinking agent is excessively reduced to less than 200 g/eq., the crosslinking density becomes too high and the mobility of the monomer and the plasticizer components is inhibited, thereby causing a problem that the recording characteristics are remarkably lowered.

More specifically, the silane crosslinking agent may include a linear polyether main chain having a weight average molecular weight of 100 to 2000, or 300 to 1000, or 300 to 700 and a silane functional group bonded to the main chain terminal or the branched chain.

The linear polyether main chain having a weight average molecular weight of 100 to 2000 may include a repeating unit represented by the following Chemical Formula 3.

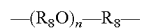
[Chemical Formula 3]

in the Chemical Formula 3, $R_8$ is an alkylene group having 1 to 10 carbon atoms, and n is an integer of 1 or more, or 1 to 50, or 5 to 20, or 8 to 10.

As the linear silane crosslinking agent introduces flexible polyether polyol into a main chain, the mobility of the components can be improved through adjustment of the glass transition temperature and crosslinking density of the matrix.

Meanwhile, a bond between the silane-based functional group and the polyether main chain may be mediated by a urethane bond. Specifically, the silane-based functional group and the polyether main chain may form a bond between them via a urethane bond. More specifically, the silicon atom contained in the silane-based functional group binds directly to the nitrogen atom of the urethane bond or via an alkylene group having 1 to 10 carbon atoms. The functional group $R_8$ contained in the polyether main chain can be directly bonded to the oxygen atom of the urethane bond.

The silane-based functional group and the polyether main chain being bonded via a urethane bond in this way is because the silane crosslinking agent is a reaction product produced through the reaction between an isocyanate compound containing a silane-based functional group and a linear polyether polyol compound having a weight average molecular weight of 100 to 2000.

More specifically, the isocyanate compound may include an aliphatic, cycloaliphatic, aromatic or aromatic-aliphatic mono-isocyanate, di-isocyanate, tri-isocyanate or poly-isocyanate; or oligo-isocyanate or poly-isocyanate of diisocyanate or triisocyante having urethane, urea, carbodiimide, acylurea, isocyanurate, allophanate, biuret, oxadiazinetrione, uretdione or iminooxadiazinedione structures.

Specific examples of the isocyanate compound containing the silane-based functional group include 3-isocyanatopropyltriethoxysilane.

Further, the polyether polyol may be, for example, multiple addition products of styrene oxide, ethylene oxide, propylene oxide, tetrahydrofuran, butylene oxide, and epichlorohydrin, and their mixed addition products and graft products, polyether polyols and polyhydric alcohols obtained by condensation of polyhydric alcohols or mixtures thereof, and those obtained by alkoxylation of amines and amino alcohols.

Specific examples of the polyether polyol include polypropylene oxide), polyethylene oxide) and combinations thereof, or poly(tetrahydrofuran) and mixtures thereof, which are in the form of random or block copolymers having an OH functionality of 1.5 to 6 and a number average molecular weight between 200 and 18000 g/mol, preferably an OH functionality of 1.8 to 4.0 and a number average molecular weight between 600 and 8000 g/mol, particularly preferably an 011 functionality of 1.9 to 3.1 and a number average molecular weight between 650 to 4500 g/mol.

In this way, when the silane-based functional group and the polyether main chain are bonded via a urethane bond, a silane crosslinking agent can be more easily synthesized.

The silane crosslinking agent has a weight average molecular weight (measured by GPC) of 1000 to 5,000,000. The weight average molecular weight means a weight average molecular weight converted in terms of polystyrene determined by GPC method. In the process of determining the weight average molecular weight in terms of polystyrene measured by the GPC method, a commonly known analyzing device, a detector such as a refractive index detector, and an analytical column can be used. Commonly applied conditions for temperature, solvent, and flow rate can be used. Specific examples of the measurement conditions may include a temperature of 30° C., chloroform solvent, and a flow rate of 1 mL/min.

Meanwhile, the content of the silane crosslinking agent may be 10 parts by weight 90 parts by weight, or 20 parts by weight to 70 parts by weight, or 22 parts by weight to 65 parts by weight based on 100 parts by weight of the (meth)acrylate-based (co)polymer.

When the content of the silane crosslinking agent in the reaction product is excessively reduced relative to 100 parts by weight of the (meth)acrylate-based (co)polymer, the curing rate of the matrix is remarkably slow and so the function as a support is lost, and the diffraction grating interface after recording can be easily collapsed. When the content of the silane crosslinking agent in the reaction product is excessively increased relative to 100 parts by weight of the (meth)acrylate-based (co)polymer, the curing rate of the matrix becomes faster, but compatibility issues with other components arises due to an excessive increase in the content of the reactive silane group and thus haze occurs.

In addition, the modulus (storage modulus) of the reaction product may be 0.01 MPa to 5 MPa. As a specific example of the modulus measuring method, the value of storage modulus (G') can be measured at a frequency of 1 Hz at room temperature (20° C. to 25° C.) using a DHR (Discovery Hybrid Rheometer) equipment from TA Instruments.

Further, the glass transition temperature of the reaction product may be −40° C. to 10° C. A specific example of the glass transition temperature measuring method includes a method of measuring a change in phase angle (loss modulus) of the film coated with a photopolymerizable composition in the temperature range from −80° C. to 30° C. under the setting conditions of strain 0.1%, frequency 1 Hz, temperature raising rate 5° C./min by using a DMA (dynamic mechanical analysis) measuring equipment.

Meanwhile, the photoreactive monomer may include a polyfunctional (meth)acrylate monomer or a monofunctional (meth)acrylate monomer.

As described above, in a portion where the monomer is polymerized in the process of photopolymerization of the photopolymer composition and the polymer is present in relatively large amounts, the refractive index becomes high. In a portion where the polymer hinder is present in relatively large amounts, the refractive index becomes relatively low, the refractive index modulation occurs, and a diffraction grating is generated by such refractive index modulation.

Specifically, one example of the photoreactive monomer may include (meth)acrylate-based α,β-unsaturated carboxylic acid derivatives, for example, (meth)acrylate, (meth)acrylamide, (meth)acrylonitrile, (meth)acrylic acid or the like, or a compound containing a vinyl group or a thiol group.

One example of the photoreactive monomer may include a polyfunctional (meth)acrylate monomer having a refractive index of 1.5 or more, or 1.53 or more, or 1.5 to 1.7. The polyfunctional (meth)acrylate monomer having a refractive index of 1.5 or more, or 1.53 or more, or 1.5 to 1.7 may include a halogen atom (bromine, iodine, etc.), sulfur (S), phosphorus (P), or an aromatic ring.

More specific examples of the polyfunctional (meth)acrylate monomer having the refractive index of 1.5 or more include bisphenol A modified diacrylate type, fluorene acrylate type (HR6022, Miwon Specialty Chemical Co., Ltd.), bisphenol fluorene epoxy acrylate type (HR6100, HR6060, HR6042, etc.—Miwon Specialty Chemical Co., Ltd.), halogenated epoxy acrylate type (HR1139, HR3362, etc.—Miwon Specialty Chemical Co., Ltd.).

Another example of the photoreactive monomer may include a monofunctional (meth)acrylate monomer. The monofunctional (meth)acrylate monomer may contain an ether bond and a fluorene functional group in the molecule. Specific examples of such monofunctional (meth)acrylate monomer include phenoxybenzyl (meth)acrylate, o-phenylphenol ethylene oxide (meth)acrylate, benzyl (meth)acrylate, 2-(phenylthio)ethyl (meth)acrylate, biphenylmethyl (meth)acrylate, or the like.

On the other hand, the photoreactive monomer may have a weight average molecular weight of 50 g/mol to 1000 g/mol, or 200 g/mol to 600 g/mol. The weight average molecular weight means a weight average molecular weight in terms of polystyrene measured by GPC method.

The photopolymer composition may include 1% to 80% by weight of the polymer matrix or a precursor thereof; 1% to 80% by weight of the photoreactive monomer; and 0.1% to 20% by weight of the photoinitiator. When the photopolymer composition further includes an organic solvent as described below, the content of the above-mentioned components is based on the total sum of these components (the total sum of the components excluding the organic solvent).

The hologram medium of the embodiments can realize a refractive index modulation value (n) of 0.0:20 or more or 0.021 or more, or 0.02:2 or more or 0.023 or more, or 0.0:20 to 0.035, or 0.027 to 0.030 even at a thickness of 5 µm to 30 µm.

Further, the hologram medium can realize a diffraction efficiency of 50% or more, or 85% or more, 85 to 99% at a thickness of 5 µm to 30 µm.

In the photopolymer composition forming the hologram medium, the respective components contained therein are uniformly mixed, dried and cured at a temperature of 20° C.

or higher, and then predetermined exposure procedures were undertaken, thereby producing a hologram for optical application in the entire visible range and the near ultraviolet region (300 to 800 nm).

In the photopolymer composition, the components of forming a polymer matrix or the precursor thereof are first uniformly mixed. Subsequently, the above-described silane crosslinking agent is mixed with the catalyst to prepare a hologram-forming process.

In the photopolymer composition, a mixing device, a stirrer, a mixer, or the like which are commonly known in the art can be used for mixing the respective components contained therein without particular limitation. The temperature in the mixing process can be 0° C. to 100° C., preferably 10° C. to 80° C., particularly preferably 20° C. to 60° C.

Meanwhile, the components of forming the polymer matrix or the precursor thereof in the photopolymer composition are first homogenized and mixed. Subsequently, at the time of adding the silane crosslinking agent, the photopolymer composition can be a liquid formulation that is cured at a temperature of 20° C. or more.

The curing temperature may vary depending on the composition of the photopolymer and the curing is promoted, for example, by heating at a temperature of from 30° C. to 180° C.

At the time of curing, the photopolymer may be in state of being injected into or coated onto a predetermined substrate or mold.

Meanwhile, as the method of recording a visual hologram on a hologram medium produced from the photopolymer composition, generally known methods can be used without particular limitation. The method described in the holographic recording method described later can be adopted as one example.

The photopolymer composition may further include a fluorine-based compound.

Since the fluorine-based compound has stability with little reactivity and has low refractive index characteristics, the refractive index of the polymer matrix can be further lowered and thus the refractive index modulation with the monomer can be maximized.

The fluorine-based compound may include at least one functional group selected from the group consisting of an ether group, an ester group and an amide group, and at least two difluoromethylene groups. More specifically, the fluorine-based compound may have a structure of the following Chemical Formula 4 in which a functional group containing an ether group is bonded to both terminals of a central functional group containing a direct bond or an ether bond between two difluoromethylene groups.

[Chemical Formula 4]

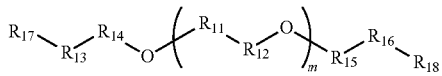

in the Chemical Formula 4, $R_{11}$ and $R_{12}$ are each independently a difluoromethwaylene group, $R_{13}$ and $R_{16}$ are each independently a methylene group, $R_{14}$ and $R_{15}$ are each independently a difluoromethylene group, $R_{17}$ and $R_{18}$ are each independently a polyalkylene oxide group, and in is an integer of 1 or more, or 1 to 10, or 1 to 3.

Preferably, in Chemical Formula 4, $R_{11}$ and $R_{12}$ are each independently a difluoromethylene group, $R_{13}$ and $R_{16}$ are each independently a methylene group, $R_{14}$ and $R_{15}$ are each independently a difluoromethylene group, $R_{17}$ and $R_{18}$ are each independently 2-methoxyethoxymethoxyl group, and m is an integer of 2.

The fluorine-based compound may have a refractive index of less than 1.45, or 1.3 or more and less than 1.45. As described above, since the photoreactive monomer has a refractive index of 1.5 or more, the fluorine-based compound can further lower the refractive index of the polymer matrix through a refractive index lower than that of the photoreactive monomer, thereby maximizing the refractive index modulation with the monomer.

Specifically, the content of the fluorine-based compound may be 30 parts by weight to 150 parts by weight, or 50 parts by weight to 110 parts by weight based on 100 parts by weight of the photoreactive monomer, and the refractive index of the polymer matrix may be 1.46 to 1.53.

When the content of the fluorine-based compound is excessively reduced relative to 100 parts by weight of the photoreactive monomer, the value of the refractive index modulation after recording is lowered due to the deficiency of low refractive index components. When the content of the fluorine-based compound is excessively increased relative to 100 parts by weight of the photoreactive monomer, haze occurs due to compatibility issues with other components, or some fluorine-based compounds may be eluted on the surface of the coating layer.

The fluorine-based compound may have a weight average molecular weight (measured by GPC) of 300 or more, or 300 to 1000. A specific method of measuring the weight average molecular weight is as described above.

Meanwhile, the polymer substrate may further include a photosensitizing dye.

The photosensitizing dye serves as photosensitizing pigment to sensitize the photoinitiator. More specifically, the photosensitizing dye may be stimulated by the light irradiated on the photopolymer composition and may also serve as an initiator to initiate polymerization of the monomer and the crosslinking monomer. The photopolymer composition forming the polymer substrate may contain 0.01% by weight to 30% by weight, or 0.05% by weight to 20% h weight of the photosensitizing dye.

Examples of the photosensitizing dye are not particularly limited, and various compounds commonly known in the art can be used. Specific examples of the photosensitizing dye include sulfonium derivative of ceramidonine, new methylene blue, thioerythrosine triethylammonium, 6-acetylamino-2-methylceramidonin, eosin, erythrosine, rose bengal, thionine, basic yellow, Pinacyanol chloride, Rhodamine 6G, Gallocyanine, ethyl violet, Victoria blue R, Celestine blue), QuinaldineRed, Crystal Violet, Brilliant Green, Astrazon orange G, Darrow Red, Pyronin Y, Basic Red 29, pyrylium iodide, Safranin O, Cyanine, Methylene Blue, Azure A, or a combination of two or more thereof.

The photopolymer composition forming the hologram medium of the embodiments can be provided as a hologram medium after uniformly mixing the respective components contained therein, followed by drying and curing at a temperature of 20° C. or higher. Therefore, the photopolymer composition may further include an organic solvent for mixing and easier application of each component included therein.

Non-limiting examples of the organic solvent include ketones, alcohols, acetates and ethers, or mixtures of two or more thereof. Specific examples of such organic solvent include ketones such as methyl ethyl ketone, methyl isobutyl ketone, acetylacetone or isobutyl ketone; alcohols such as methanol, ethanol, n-propanol, i-propanol, n-butanol, i-butanol or t-butanol; acetates such as ethyl acetate, i-propyl acetate, or polyethylene glycol monomethyl ether acetate; ethers such as tetrahydrafuran or propylene glycol monomethyl ether; or a mixture of two or more thereof.

The organic solvent may be added at the time of mixing the respective components contained in the photopolymer composition, or may be contained in the photopolymer composition while adding the respective components in a state of being dispersed or mixed in an organic solvent. When the content of the organic solvent in the photopolymer composition is too low, the flowability of the photopolymer composition may be lowered, resulting in the occurrence of defects such as the occurrence of striped patterns on the finally produced film. In addition, when the organic solvent is added excessively, the solid content becomes low, coating and film formation are not sufficiently performed, and thus, the physical properties and surface characteristics of the film may be deteriorated and defects may occur during the drying and curing process. Thus, the photopolymer composition may include an organic solvent such that the total solid content concentration of the components contained is 1% by weight to 70% by weight, or 2% by weight to 50% by weight.

Meanwhile, the photopolymer composition forming the polymer substrate may include a photoinitiator. The photoinitiator is a compound which is activated by light or actinic radiation and initiates polymerization of a compound containing a photoreactive functional group such as the photoreactive monomer.

As the photoinitiator, commonly known photoinitiators can be used without particular limitation, but specific examples thereof include a photoradical polymerization initiator, a photocationic polymerization initiator, and a photoanionic polymerization initiator.

Specific examples of the photoradical polymerization initiator include imidazole derivatives, bisimidazole derivatives, N-aryl glycine derivatives, organic azide compounds, titanocene, aluminate complex, organic peroxide, N-alkoxypyridinium salts, thioxanthone derivatives, amine derivative or the like. More specifically, examples of the photoradical polymerization initiator include 3-di(t-butyldioxycarbonyl) benzophenone, 3,3',4,4"-tetrakis(t-butyldioxycarbonyl)benzophenone, 3-phenyl-5-isoxazolone, 2-mercapto benzimidazole, bis(2,4,5-triphenyl)imidazole, 2,2-dimethoxy-1,2-diphenylethane-1-one (product name: Irgacure 651/manufacturer: BASF), 1-hydroxy-cyclohexyl-phenyl-ketone (product name: Irgacure 184/manufacturer: BASF), 2-benzyl-2-dimethylamino-1-(4-morpholinophenyl)-butanone-1 (product name: Irgacure 369/manufacturer: BASF), and bis(η5-2,4-cyclopentadiene-1-yl)-bis(2,6-difluoro-3-(1H-pyrrole-1-yl)-phenyl)titanium (product name: Irgacure 784/manufacturer: BASF), Ebecryl P-115 (manufacturer: SK entis), or the like.

The photo cationic polymerization initiator may include a diazonium salt, a sulfonium salt, or an iodonium salt, and examples thereof include sulfonic acid esters, imidosulfonates, dialkyl-4-hydroxysulfonium salts, arylsulfonic acid-p-nitrobenzyl ester, silanol-aluminum complexes, (η6-benzene) (η5-cyclopentadienyl)iron (II), or the like. In addition, benzoin tosylate, 2,5-dinitrobenzyltosylate, N-tosylphthalic acid imide, or the like can be mentioned. More specific examples of the photocationic polymerization initiator include commercially available products such as Cyracure UVI-6970, Cyracure UVI-6974 and Cyracure UVI-6990 (manufacturer: Dow Chemical Co. in USA), Irgacure 264 and Irgacure 250 (manufacturer: B ASP) or CIT-1682 (manufacturer: Nippon Soda).

The photo anionic polymerization initiator may include a borate salt, and examples thereof include butyrylchlorine butyl triphenylborate or the like. More specific examples of the photoanionic polymerization initiator include commercially available products such as Borate V (manufacturer: Spectra Group) or the like.

In addition, the photopolymer composition may include monomolecular (type I) initiator or bimolecular (type II) initiator. The (type I) system for free radical photopolymerization may include, for example, an aromatic ketone compounds in combination with a tertiary amine, such as benzophenone, alkylbenzophenone, 4,4'-bis(dimethylamino) benzophenone (Michler's ketone), anthrone and halogenated benzophenone, or a mixture of these types. The bimolecular (type II) initiator may include benzoin and derivatives thereof, benzyl katal, acylphosphine oxide, for example, 2,4,6-trimethylbenzoyldiphenylphosphine oxide, bisacylophosphine oxide, phenylglyoxyl ester, camphorquinone, alpha-aminoalkylphenone, alpha-dialkoxyacetophenone, 1-[4-(phenylthio)phenyl]octane-1,2-dione 2-(O-benzoyloxime), alpha-hydroxyalkylphenone, and the like.

The photopolymer composition tray further include other additives, catalysts, and the like. For example, the photopolymer composition may include a catalyst which is commonly known for promoting polymerization of the polymer matrix or photoreactive monomer.

Examples of the catalyst include tin octanoate, zinc octanoate, dibutyltin dilaurate, dimethylbis[(1-oxoneodecyl) oxy]stannane, dimethyltin dicarboxylate, zirconium bis(ethylhexanoate), zirconium acetylacetonate, p-toluenesulfonic acid or tertiary amines such as 1,4-diazabicyclo[2.2.2]octane, diazabicyclononane, diazabicyclo uridecane, 1,1,3,3-tetramethylguanidine, 1,3,4,6,7,8-hexahydro-1-methyl-2H-pyrimido(1,2-a)pyrimidine, and the like.

Examples of the other additives include a defoaming agent or a phosphate-based plasticizer. As the defoaming agent, a silicone-based reactive additive may be used, and an example thereof is Tego Rad 2500. Examples of the plasticizer include phosphate compounds such as tributyl phosphate. The plasticizer may be added together with the fluorine-based compound at a weight ratio of 1:5 to 5:1. The plasticizer may have a refractive index of less than 1.5 and a molecular weight of 700 or less.

Meanwhile, the hologram medium can be provided by a recording method of a hologram medium comprising selectively polymerizing photoreactive monomers contained in the photopolymer composition by a coherent laser.

As described above, through the process of mixing and curing the photopolymer composition, it is possible to produce a medium in a form in which no visual hologram is recorded, and a visual hologram can be recorded on the medium through a predetermined exposure process.

A visual hologram can be recorded on the media provided through the process of mixing and curing the photopolymer composition, using known devices and methods under commonly known conditions.

Meanwhile, according to another embodiment of the present disclosure, an optical element including a hologram medium can be provided.

Specific examples of the optical element include optical lenses, mirrors, deflecting mirrors, filters, diffusing screens, diffraction elements, light guides, waveguides, holographic optical elements having projection screen and/or mask functions, medium of optical memory system and light diffusion plate, optical wavelength multiplexers, reflection type, transmission type color filters, and the like.

An example of an optical element including the hologram medium may include a hologram display device.

The hologram display device includes a light source unit, an input unit, an optical system, and a display unit. The light source unit is a portion that irradiates a laser beam used for providing, recording, and reproducing three-dimensional image information of art object in the input unit and the display unit. Further, the input unit is a portion that previously inputs three-dimensional image information of an object to be recorded on the display unit, and for example, three-dimensional information of an object such as the intensity and phase of light for each space can be inputted into an electrically addressed liquid crystal SLM, wherein an input beam may be used. The optical system may include a mirror, a polarizer, a beam splitter, a beam shutter, a lens, and the like. The optical system can be distributed into an input beam for sending a laser beam emitted from the light source unit to the input unit, a recording beam for sending the laser beam to the display unit, a reference beam, an erasing beam, a reading beam, and the like.

The display unit can receive three-dimensional image information of an object from an input unit, record it on a hologram plate comprising an optically addressed SLM, and reproduce the three-dimensional image of the object. In this case, the three-dimensional image information of the object can be recorded via interference of the input beam and the reference beam. The three-dimensional image information of the object recorded on the hologram plate can be reproduced into a three-dimensional image by the diffraction pattern generated by the reading beam. The erasing beam can be used to quickly remove the formed diffraction pattern. On the other hand, the hologram plate can be moved between a position at which a three-dimensional image is inputted and a position at which a three-dimensional image is reproduced.

Advantageous Effects

According to the present disclosure, there can be provided a hologram medium which can prevent light loss due to reflection, scattering, and absorption caused by the influence of a light-transmissive substrate, can realize a higher refractive index modulation value and diffraction efficiency even in the range of a thin thickness, and can provide lighter and smaller-sized products by removing the substrate when applied to VR (Virtual Reality) devices or AR (Augmented Reality) devices, and an optical element comprising the hologram medium.

BRIEF DESCRIPTION OF THE DRAWINGS

FIG. 1 is a line profile of the shape of the surface of the hologram medium of Example 1 measured using an atomic force microscope (AFM).

FIG. 2 is a line profile of the shape of the surface of the hologram medium of Example 2 measured using an atomic force microscope (AFM).

FIG. 3 is a line profile of the shape of the surface of the hologram medium of Example 3 measured using an atomic force microscope (AFM).

FIG. 4 is a line profile of the shape of the surface of the hologram medium of Example 4 measured using an atomic force microscope (AFM).

FIG. 5 is a line profile of the shape of the surface of the hologram medium of Comparative Example 1 measured using an atomic force microscope (AFM).

FIG. 6 is a line profile of the shape of the surface of the hologram medium of Comparative Example 2 measured using an atomic force microscope (AFM).

FIG. 7 is a line profile of the shape of the surface of the hologram medium of Comparative Example 3 measured using an atomic force microscope (AFM).

Hereinafter, the present disclosure will be described in more detail by way of the following examples. However, these examples are given for illustrative purposes only and are not intended to limit the scope of the present disclosure thereto.

PREPARATION EXAMPLE

Preparation Example 1: Preparation Method of a (Meth)Acrylate-Based (Co)Polymer in which a Silane-Based Functional Group is Located in a Branch Chain 154 g of butyl acrylate and 46 g of KBM-503 (3-methacryloxypropyltrimethoxysilane) were added to a 2 L jacket reactor and diluted with 800 g of ethyl acetate. The reaction temperature was set at about 60 to 70° C., and stirring was carried out for about 30 minutes to 1 hour. 0.02 g of n-dodecyl mercaptan was further added, and stirring was further carried out for about 30 minutes. Subsequently, 0.06 g of AIBN as a polymerization initiator was added and the polymerization was carried out at the reaction temperature for 4 hours or more and maintained until the residual acrylate content became less than 1%, thereby preparing a (meth)acrylate-based (co)polymer in which a silane-based functional group was located in a branch chain (weight average molecular weight of about 500,000 to 600,000, —Si(OR)$_3$ equivalent weight of 1019 g/eq.).

Preparation Example 2: Preparation Method of a (Meth)Acrylate-Based (Co)Polymer in which a Silane-Based Functional Group is Located in a Branch Chain 180 g of butyl acrylate and 120 g of KBM-503 (3-methacryloxypropyltrimethoxysilane) were added to a 2 L jacket reactor and diluted with 700 g of ethyl acetate. The reaction temperature was set at 60 to 70° C., and stirring was carried out for about 30 minutes to 1 hour. 0.03 g of n-dodecyl mercaptan was further added, and stirring was further carried out for about 30 minutes. Subsequently, 0.09 g of AIBN as a polymerization initiator was added and the polymerization was carried out at the reaction temperature for 4 hours or more and maintained until the residual acrylate content became less than 1%, thereby preparing a (meth)acrylate-based (co)polymer in which a silane-based functional group was located in a branch chain (weight average molecular weight of about 500,000 to 600,000, —Si(OR)$_3$ equivalent weight=586 g/eq.).

Preparation Example 3: Preparation Method of a (Meth)Acrylate-Based (Co)Polymer in which a Silane-Based Functional Group is Located in a Branch Chain 255 g of butyl acrylate and g of KBM-503 (3-methacryloxypropyitrimethoxysilane) were added to a 2 L jacket, reactor and diluted with 700 g of ethyl acetate. The reaction temperature was set at 60 to 70° C., and stirring was carried out for about 30 minutes to 1 hour. 0.03 g of n-dodecyl mercaptan was further added, and stirring was further carried out for about 30 minutes. Subsequently, 0.09 g of AIBN as a polymerization initiator was added and the polymerization was carried out at the reaction temperature for 4 hours or more and maintained until the residual acrylate content became less than 1%, thereby preparing a (meth) acrylate-based (co)polymer in which a silane-based functional group was located in a branch chain (weight average molecular weight of about 500,000 to 600,000, —Si(OR)$_3$ equivalent weight of 1562 g/eq.).

Preparation Example 4: Preparation Method of Silane Crosslinking Agent

In a 1000 ml flask, 19.79 g of KBE-9007 (3-isocyanatopropyltriethoxysilane), 12.80 g of PEG-400 and 0.57 g of DBTDL were added and diluted with 300 g of tetrahydrofuran. The mixture was stirred at room temperature until it was confirmed by TLC that all the reactants were consumed, and then the reaction solvent was completely removed under reduced pressure.

28 g of a liquid product having a purity 95% or more was separated in a yield of 91% through column chromatography under a developing solution condition of dichloromethane:methyl alcohol=30:1, thereby obtaining the above-mentioned silane crosslinking agent.

Preparation Example 5: Preparation Method of Non-Reactive Low Refractive Index Material In a 1000 ml flask, 20.51 g of 2,2'-((oxybis(1,1,2,2-tetrafluoroethane-2,1-diyl))bis(oxy))bis(2,2-difluoroethan-1-ol) was added and then dissolved in 500 g of tetrahydrofuran. 4.40 g of sodium hydride (60% dispersion in mineral oil) was carefully added over several times while stirring at 0° C. After stirring at 0° C. for 20 minutes, 12.50 ml of 2-methoxyethoxymethyl chloride was slowly dropped. When it was confirmed by $^1$H NMR that all the reactants were consumed, the reaction solvent was completely removed under reduced pressure. The organic layer was collected by extracting with 300 g of dichloromethane three times, and filtered with magnesium sulfate, and then the pressure was reduced to remove all the dichloromethane to obtain 29 g of a liquid product having a purity of 95% or more in a yield of 98%.

Example: Preparation of Photopolymer Composition and Hologram Medium

1. Preparation of Photopolymer Composition

As shown in Table 1 or Table 2 below, the silane polymers obtained in Preparation Examples 1 to 3, photoreactive monomer refractive index acrylate, refractive index E600, HR 6022 [Miwon]), the non-reactive low refractive index material of Preparation Example 5, tributyl phosphate ([TBP], molecular weight 266.31, refractive index 1.424, manufactured by Sigma-Aldrich), Safranin O (dye, manufactured by Sigma-Aldrich), Ebecryl P-415 (SK entis), Borate V (Spectra Group), Irgacure 250 (BASF), silicone-based reactive additive (Tego Rad 2500) and methyl isobutyl ketone (MIBK) were mixed in a state cutting off the light, and stirred with a paste mixer for about 10 minutes to obtain a transparent coating solution.

The silane crosslinking agent obtained in Preparation Example 4 was added to the coating solution, and further stirred for about 10 minutes. Subsequently, 0.02 g of DBTDL as a catalyst was added to the coating solution, stirred for about 1 minute, and then coated in a thickness of 6 μm onto a TAC substrate with a thickness of 80 μm using a Meyer bar and dried at 40° C. for 1 hour.

Then, the sample was allowed to stand for 24 hours or more in a dark room under constant temperature and humidity conditions of about 25° C. and 50% RH.

2. Preparation of Hologram Medium (1) The above-prepared photopolymer-coated surfaces were laminated on a slide glass, and fixed so that a laser first passed through the glass surface at the time of recording.

(2) Measurement of Diffraction efficiency (η)

A holographic recording was done via interference of two interference lights (reference light and object light), and the transmission-type recording was done so that the two beams were incident on the same side of the sample. The diffraction efficiencies are changed according to the incident angle of the two beams, and become non-slanted when the incident angles of the two beams are the same. In the non-slanted recording, the diffraction grating is generated vertically to the film because the incident angles of the two beams are the same on the normal basis.

The recording (2θ=45°) was done in a transmission-type non-slanted manner using a laser with a wavelength of 532 nm, and the diffraction efficiency (q) was calculated according to the following general formula 1.

$$\eta = \frac{P_D}{P_D + P_T} \quad \text{[General Formula 1]}$$

in the general formula 1, η is a diffraction efficiency, P D is an output amount (mW/cm$^2$) of the diffracted beam of a sample after recording, and P T is an output amount (mW/cm$^2$) of the transmitted beam of the recorded sample.

(3) Measurement of Refractive Index Modulation Value (n)

The lossless dielectric grating of the transmission-type hologram can calculate the refractive index modulation value (Δn) from the following general formula 2.

$$\eta(DE) = \sin^2\left(\sqrt{v^2}\right) = \sin^2\left(\frac{\pi \Delta n d}{\lambda \cos\theta}\right) \quad \text{[General Formula 2]}$$

in the general formula 2, d is a thickness of the photopolymer layer, Δn is a refractive index modulation value, η(DE) is a diffraction efficiency, and λ is a recording wavelength.

(4) Measurement of the Loss Amount of Laser ($I_{loss}$)

The loss amount of laser ($I_{loss}$) can be calculated from the following general formula 3.

$$I_{loss} = 1 - \{(P_D + P_T)/I_O\} \quad \text{[General Formula 3]}$$

in the general formula 3, $P_D$ is an output amount (mW/cm$^2$) of the diffracted beam of the sample after recording, PT is an output amount (mW/cm$^2$) of the transmitted beam of the recorded sample, and $I_O$ is an intensity of the recording light, (5) Surface Observation of the Hologram Medium The shape and size of the linear pattern formed on one surface of the hologram medium obtained in Examples were measured using an atomic force microscope (XE7) manufactured by Park Systems. Then, the distance between the adjacent minimum and maximum values was measured through a line profile from the confirmed surface shape.

At this time, in the measurement result, the minimum value means a point where the y-axis value decreases and then increases, the maximum value means a point at which the y-axis value increases and then decreases, and "adjacent" means the most adjacent maximum value (or minimum value) with a height difference of 5 nm or more from the minimum value (or maximum value).

As for the standard error of the adjacent minimum and maximum values, the distance between the adjacent minimum and maximum values having a height difference of 5 nm or more was measured from the line profile of the surface profile measured by atomic force microscopy, and the standard error was calculated according to the following general formula 1.

$$SE = \sigma/\sqrt{n} \qquad \text{[General Formula 1]}$$

in the general formula 1, SE is a standard error, σ is a standard deviation, and n is a number.

FIGS. 1 to 4 are line profiles of the shapes of the surfaces of the hologram media of Examples 1 to 4 measured using an atomic force microscope.

(6) Measurement of Surface Energy

In the hologram medium obtained in Examples, the surface energy of one surface making contact with the substrate was measured by the following method.

For the sample, the substrate was cleanly peeled from the coating film laminated on the glass surface, and then the surface energy of one surface making contact with the substrate was measured with a contact angle measuring device. The contact angle of di-water (Gebhardt) and di-iodomethane (Owens) was measured as 10 points using a DSA100 contact angle measuring equipment form Kruss. After calculating the average value, the surface energy was measured by converting the average contact angle into surface energy. In the measurement of the surface energy, the contact angle was converted to the surface energy by using Dropshape Analysis software and applying the following General Formula 2 of OWRK (Owen, Wendt, Rable, Kaelble) method.

$$\gamma_L(1+\cos\theta) = 2\sqrt{\gamma_S^D \gamma_L^D} + 2\sqrt{\gamma_S^P \gamma_L^P}$$

TABLE 1

Measurement results of Experimental Examples of the photopolymer compositions (unit: g) of Examples and the hologram recording medium prepared therefrom

| Category | | Example 1 | Example 2 | Example 3 | Example 4 |
|---|---|---|---|---|---|
| (Meth) acrylate-based copolymer | Preparation Example 1 | 23.1 | 23.1 | | |
| | Preparation Example 2 | | | 19.3 | |
| | Preparation Example 3 | | | | 25.4 |
| Linear silane crosslinking agent | Preparation Example 4 | 8.4 | 8.4 | 12.3 | 6.1 |
| Photoreactive monomer | HR6022 | 31.5 | 31.5 | 31.5 | 31.5 |
| Dye | safranin O | 0.1 | 0.1 | 0.1 | 0.1 |
| Amine | Ebecryl P-115 | 1.7 | 1.7 | 1.7 | 1.7 |
| Borate salt | Borate V | 0.3 | 0.3 | 0.3 | 0.3 |
| Onium salt | Irgacure 250 | 0.1 | 0.1 | 0.1 | 0.1 |
| Non-reactive plasticizer (TBP) | Tributyl phosphate | 0 | 17.2 | 17.2 | 17.2 |
| Non-reactive low refractive material(P3) | Preparation Example 5 | 34.4 | 17.2 | 17.2 | 17.2 |
| Catalyst | DBTDL(dibutyltin dilaurate) | 0.02 | 0.02 | 0.02 | 0.02 |
| Additive | Tego Rad 2500 | 0.3 | 0.3 | 0.3 | 0.3 |
| Solvent | MIBK | 300 | 300 | 300 | 300 |
| Coating thickness (unit: μm) | | 6 | 6 | 6 | 6 |
| $I_{loss}$(%) | | 25 | 19 | 21 | 20 |
| Surface energy | | 52 mN/m | 53 mN/m | 51 mN/m | 55 mN/m |
| Standard error (SE) | | 5.72 nm | 2.26 nm | 6.72 nm | 4.30 nm |
| Diffraction efficiency (η) | | 67% | 69% | 80% | 46% |
| Δn | | 0.025 | 0.027 | 0.030 | 0.022 |

Non-reactive plasticizer: Tributyl phosphate (molecular weight of 266.31, refractive index of 1.424, purchased from Sigma-Aldrich)

Comparative Example: Preparation of Hologram Media (1) Synthesis of Polyol 34.5 g of methyl acrylate, 57.5 g of butyl acrylate, and 8 g of 4-hydroxy butyl acrylate were added to a 2 L jacket reactor, and diluted with 150 g of ethyl acetate. Stirring was performed for about 1 hour while maintaining the temperature of the jacket reactor at 60 to 70° C. Then, 0.035 g of n-dodecyl mercaptan was further added to the reactor, and further stirring was performed for about 30 minutes. Then, 0.04 g of a polymerization initiator AIBN (2,2'-azo-bisisobutyronitrile) was added thereto, and polymerized at a temperature of about 70° C. for about 4 hours, and maintained until the content of the residual acrylate monomer became 1% by weight, and thereby the polyol was synthesized. At this time, the obtained polyol had a weight average molecular weight of about 700,000 in terms of polystyrene measured by GPC method, and the OH equivalent measured using KOH titration was 1802 g/OH mol.

(2) Preparation of Photopolymer Composition

The polyol of Preparation Example 1, the photoreactive monomer (high refractive acrylate, refractive index of 1.600, HR6022 [Miwon]), saftanin O (dye, manufactured by Sigma Aldrich), the non-reactive low refractive material of Preparation Example 5, (tributyl phosphate [TBP], molecular weight of 266.31, refractive index of 1.424, manufactured by Sigma Aldrich), Ebecryl P-115 (SK entis), Borate V (Spectra group), Irgacure 250 (BASF), and methyl isobutyl ketone (MIBK) were mixed in a state cutting off the light, and stirred with a paste mixer for about 10 minutes to obtain a transparent coating solution.

MFA-75X (Asahi Kasei, hexa-functional isocyanate, diluted to 75% by weight in xylene) was added to the coating solution, and further stirred for about 5-10 minutes. DBIDL (dibutyltin dilaurate) as a catalyst was added thereto, stirred for about 1 minute, and then coated in a thickness of 7 μm onto a TAC substrate with a thickness of 80 μm using a Meyer bar and dried at 40° C. for 1 hour.

(3) Preparation of Hologram Medium

A hologram medium was prepared in the same manner as in the above Examples, and the diffraction efficiency (η), the refractive index modulation value (n) and the laser loss ($I_{loss}$) were measured according to the same method and the same conditions as in Examples.

(4) Surface Observation of Hologram Media

The shape and size of the linear pattern formed on one surface of the hologram media obtained in Comparative Examples and the surface of the hologram media were measured and observed in the same manner as in Examples.

FIGS. 5 to 7 are line profiles of the shapes of the surfaces of the hologram media of Comparative Examples 1 to 4 measured using an atomic force microscope.

Examples had a surface energy of about 51 to 55 N/m, and it was also confirmed that it was easily peeled off from a TAC substrate used in the manufacturing process of the hologram recording medium.

In contrast, as seen in FIGS. 5 to 7, it was confirmed that in the hologram media of Examples, the standard error of the distance in the cross-sectional direction of the polymer substrate between the maximum value of the height of the one fine protrusion and the minimum value of the height of the adjacent fine protrusion exceeds 20 nm, and in such hologram media, image distortion may occur or additional scattering or interference of diffracted light may occur, and diffraction efficiency may also decrease. Specifically, as shown in Tables 1 and 2, it was confirmed that the photopolymer-coated films provided by the compositions of Comparative Examples have a relatively low diffraction efficiency of 30% or less and a refractive index modulation value (Δn) of 0.015 or less as compared with Examples.

In addition, as shown in Table 2 above, it was confirmed that the other one surface of the hologram recording medium of Comparative Examples had a surface energy of about 38 to 40 N/m. However, these hologram recording media did not peel off from the TAC substrate used in the manufacturing process, and therefore, there is a limit in actual applications in that the optical design must be proceeded in consideration of the reflection, scattering, and absorption effects by the substrate.

The invention claimed is:

1. A hologram recording medium having one surface with a higher surface energy than a polymer resin layer of a base

TABLE 2

| Category | | Comparative Example 1 | Comparative Example 2 | Comparative Example 3 |
|---|---|---|---|---|
| Polyol | Preparation Example 1 | 26.2 | 26.2 | 26.2 |
| Isocyanate | MFA-75X | 6.4 | 6.4 | 6.4 |
| Photoreactive monomer | HR6022 | 31 | 31 | 31 |
| Dye | safranin O | 0.1 | 0.1 | 0.1 |
| Amine | Ebecryl P-115 | 1.7 | 1.7 | 1.7 |
| Borate salt | Borate V | 0.3 | 0.3 | 0.3 |
| Onium salt | Irgacure 250 | 0.1 | 0.1 | 0.1 |
| Non-reactive plasticizer(TBP) | Tributyl phosphate | 16.9 | 33.8 | |
| Non-reactive low refractive material (P3) | Preparation Example 5 | 16.9 | | 33.8 |
| Catalyst | DBTDL (dibutyltin dilaurate) | 0.02 | 0.02 | 0.02 |
| Additive | Tego Rad 2500 | 0.5 | 0.5 | 0.5 |
| Solvent | MIBK | 400 | 400 | 400 |
| Coating thickness (unit: μm) | | 7 | 7 | 7 |
| Surface energy | | 40 mN/m | 42 mN/m | 38 mN/m |
| Standard error (SE) | | 187.98 nm | 232.23 nm | 150.50 nm |
| Δn | | 0.010 | 0.011 | 0.013 |
| Diffraction efficiency (η) | | 19% | 22% | 28% |

As seen from FIGS. 1 to 4, it was confirmed that in the hologram media of Examples, the standard error of the distance in the cross-sectional direction of the polymer substrate between the maximum value of the height of the one fine protrusion and the minimum value of the height of the adjacent fine protrusion is 20 nm or less. As shown in Tables 1 and 2, and that the hologram media of Examples have a refractive index modulation value (ΔN) of 0.020 or more and a diffraction efficiency of 40% or more.

Further, as shown in Table 1 above, it was confirmed that the other one surface of the hologram recording medium of substrate containing at least one polymer selected from the group consisting of triacetyl cellulose, alicyclic olefin polymer and polyethylene terephthalate, wherein the hologram recording medium has one surface with a surface energy of at least 50 mN/m, wherein the hologram recording medium comprises a polymer layer which includes a cross-linked product between a polymer matrix including a (meth)acrylate-based (co)polymer having a silane-based functional group in a branched chain, and a silane crosslinking agent; and a photoreactive monomer.

2. The hologram recording medium according to claim 1, wherein the one surface of the hologram recording medium has a surface energy of 501 mN/m to 60 mN/m.

3. The hologram recording medium according to claim 1, wherein a fine pattern is for reed on a surface of the polymer layer that is the other surface of the hologram recording medium.

4. The hologram recording medium according to claim 3, wherein the fine pattern has a shape including two or more fine protrusions in which a maximum value of the height and minimum value of the height are alternately repeated based on the cross section of the polymer layer, and a standard error of the distance in the cross-sectional direction of the polymer layer between the maximum value of the height of the one fine protrusion and the minimum value of the height of the adjacent fine protrusion is 20 nm or less.

5. The hologram recording medium according to claim 4, wherein the distance in the cross-sectional direction of the polymer layer between the maximum value of the height of the one fine projection and the minimum value of the adjacent fine projection is 0.2 μm to 2 μm.

6. The hologram recording medium according to claim 4, wherein an amplitude which is a difference between the maximum value of the height of the one fine projection and the minimum value of the height of the adjacent fine projection is 5 to 50 nm.

7. The hologram recording medium according to claim 1, wherein the polymer matrix includes 10 parts by weight to 90 parts by weight of the silane crosslinking agent based on 100 parts by weight of the (meth)acrylate-based (co)polymer.

8. The hologram recording medium according to claim 1, wherein the (meth)acrylate-based (co)polymer having a silane-based functional group in a branched chain has an equivalent weight of the silane-based functional group of 300 g/eq. to 2000 g/eq.

9. The hologram recording medium according to claim 1, wherein the silane crosslinking agent includes a linear polyether main chain having a weight average molecular weight of 100 to 2000 and a silane-based functional group bonded to the terminal or branched chain of the main chain.

10. The hologram recording medium according to claim 1, wherein the polymer layer further includes a fluorine-based compound including at least one functional group selected from the group consisting of an ether group, an ester group and an amide group, and at least two difluoromethylene groups.

11. An optical element comprising the hologram medium of claim 1 having a hologram recorded therein.

* * * * *